(12) United States Patent
Lane et al.

(10) Patent No.: US 6,414,364 B2
(45) Date of Patent: Jul. 2, 2002

(54) ISOLATION STRUCTURE AND PROCESS THEREFOR

(75) Inventors: Richard Lane, Boise, ID (US); Randhir Thakur, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/911,580

(22) Filed: Jul. 24, 2001

Related U.S. Application Data

(63) Continuation of application No. 09/135,474, filed on Aug. 17, 1998, now Pat. No. 6,265,282.

(51) Int. Cl.[7] .......................... H01L 29/76; H01L 21/76
(52) U.S. Cl. .................. 257/397; 257/510; 428/424; 428/435
(58) Field of Search .............................. 438/424, 433, 438/435; 257/397, 510

(56) References Cited

U.S. PATENT DOCUMENTS

| | | | |
|---|---|---|---|
| 4,394,196 A | 7/1983 | Iwai | 148/187 |
| 4,725,562 A | * 2/1988 | El-Kareh et al. | 438/424 |
| 4,942,137 A | 7/1990 | Sivan et al. | 437/63 |
| 5,258,332 A | 11/1993 | Horioka et al. | 437/228 |
| 5,308,784 A | * 5/1994 | Kim et al. | 438/424 |
| 5,470,781 A | 11/1995 | Chidambarrao et al. | 437/68 |
| 5,578,518 A | 11/1996 | Koike et al. | 437/67 |
| 5,712,185 A | 1/1998 | Tsai et al. | 437/67 |
| 5,719,085 A | 2/1998 | Moon et al. | 438/424 |
| 5,766,823 A | 6/1998 | Fumitomo | 430/314 |
| 5,780,346 A | 7/1998 | Arghavani et al. | 438/296 |
| 5,837,612 A | 11/1998 | Ajuria et al. | 438/697 |
| 5,858,857 A | 1/1999 | Ho | 438/424 |
| 5,863,827 A | 1/1999 | Joyner | 438/425 |
| 5,880,004 A | 3/1999 | Ho | 438/421 |
| 5,923,993 A | 7/1999 | Sahota | 438/427 |
| 5,976,951 A | * 11/1999 | Huang et al. | 438/435 |
| 6,001,706 A | * 12/1999 | Tan et al. | 438/424 |
| 6,046,477 A | * 4/2000 | Noble | 257/347 |
| 6,048,771 A | 4/2000 | Lin et al. | 438/296 |
| 6,175,140 B1 | * 1/2001 | Kajiyama | 257/401 |

OTHER PUBLICATIONS

Stanley Wolf Silicon Processing for the VSLI Era vol. 2 1990 Lattice Press p. 434.*
Chen, C., et al., "A Novel .025 um Shallow Trench Isolation Technology", Unived Microelectronics Corp., Advanced Technology Development Department, Science–Based Industrial Park, Hsin–Chu, Taiwan, ROC.
Ehrlich, D.J., et al., "Emerging Technologies for In Situ Processing", *High Technology Manufacturing: Critical Issues for the Future*, Martinus Nijhoff Publishers, 45–54, (1988).
Fazan, P.C., et al., "A Highly Manufacturable Trench Isolation Process for Deep Submicron DRAMS", *Micron Semiconductor, Inc.*, 3.6.1–3.6.4, (1993).
Inokawa, H., et al., "Ultranarrow Trench–isolated 0.2–um CMOS and its Application to Ultralow–power Frequency Dividers", 36.3.1–36.3.4, (1993).
Wolf, S., "Silicon Processing for the VLSI Era", vol. 3, Lattice Press, 337, (1995).
Wolf, S., "Silicon Processing for the VLSI Era", vol. 3, *the Submicron Mosfet*, Lattice Press, 336 and 340 and 367, (1995).

* cited by examiner

Primary Examiner—Olik Chaudhuri
Assistant Examiner—David S Blum
(74) Attorney, Agent, or Firm—Schwegman, Lundberg, Woessner & Kluth, P.A.

(57) ABSTRACT

A novel shallow-trench isolation (STI) structure and process for forming it is described. More particularly, a recess is formed in a semiconductor substrate. An oxide layer is formed in the recess using thermal oxidation or high-pressure oxidation. If the oxide layer is formed by high-pressure oxidation, then a nitrogen containing gas may be flowed into a high-pressure oxidation chamber to add nitrogen to the oxide layer. The recess may then be filled with a dielectric layer by a deposition process. Alternately, the dielectric layer may be formed using high-pressure oxidation.

39 Claims, 4 Drawing Sheets

ISOLATION STRUCTURE AND PROCESS THEREFOR

This application is a Continuation of U.S. Ser. No. 09/135,474 filed Aug. 17, 1998. Now U.S. Pat. No. 6,265, 282.

TECHNICAL FIELD OF THE INVENTION

The present invention generally relates to an isolation structure for semiconductor devices, and more particularly relates to a shallow-trench isolation (STI) structure.

BACKGROUND OF THE INVENTION

As semiconductor technologies evolve, some conventional approaches for forming quarter (0.25) micron and smaller features become more problematic. One such example is local oxidation of silicon (LOCOS) for forming field oxide regions in an array of memory integrated circuit cells. In LOCOS, a nitride hard mask is patterned to cover designated active areas on a silicon substrate. During LOCOS oxidation of exposed field regions of the silicon substrate, the nitride hard mask deflects upwardly at the interface of field regions and active areas owing to encroachment of the LOCOS under the mask (i.e., encroachment into the active areas). Additionally, LOCOS formation is inherently non-planar, which makes it relatively difficult for use in 0.25 micron or smaller geometries in large-scale integration for isolating one device from another.

Consequently, shallow-trench isolation (STI) has been suggested as a practical alternative to LOCOS for 0.25 micron and smaller topographies. With STI, a more planar structure may be achieved, especially when compared with semi-recessed LOCOS. For example, an STI structure may be planarized by subsequent etch back or chemical-mechanical polishing (CMP) to form an optimally planar surface.

A problem with STI is that a recess in an STI field oxide near an active area edge causes sub-threshold voltage conduction (leakage current) across a metal-oxide-semiconductor-field-effect-transistor (MOSFET) adjacent to a defective STI structure. It is believed that the field oxide recess causes field crowding at the active area edge of the trench leading to sub-threshold conduction. Such a recess may be caused by over polishing during CMP or deglazing.

To address this problem, others have suggested that a gate oxide be grown prior to forming an STI trench. The formed trench is then filled with an oxide. A CMP step is employed to form a surface of the field oxide planar to the deposited gate oxide (ie., above the silicon wafer surface). Accordingly, this process avoids a field oxide recess near a gate edge and a field edge of an adjacent transistor. However, this process necessitates forming a gate oxide early, which is then subjected to subsequent processing steps which may adversely impact the quality or the integrity of the gate oxide.

Accordingly, it would be desirable to provide an STI structure that provides less probability of leakage current. Moreover, it would be desirable to provide a process which reduces probability of subthreshold voltage transistor leakage, but which also allows for gate formation later in the process.

SUMMARY OF THE INVENTION

The present invention provides structure for isolating one integrated circuit from another and method for forming an isolation structure. More particularly, an STI structure in accordance with the present invention may be employed for electrically isolating a plurality of devices in an integrated circuit from one another.

In accordance with the present invention, a base material member, such as a semiconductor substrate, has one or more recesses formed about a surface of the member. Pitch or spacing of these recesses may be determined at least in part by circuit requirements and process equipment limitations. An oxide layer is formed in the recesses. The oxide layer may be formed by one or more sub-layers, and may be formed by high-pressure oxidation (HIPOX) or by thermal oxidation. Notably, use of HIPOX facilitates oxidation more readily along the bottom, as opposed to the sidewalls, of a recess, and thus aspect ratio is improve for any subsequent deposition to fill the recess.

In the HIPOX embodiment, impurities (e.g., dopants) may be implanted in the semiconductor substrate at the bottom of the recess prior to formation of the oxide layer. This implanting may be used to aid subsequent oxidation. In the HIPOX embodiment, nitrogen may be flowed into a HIPOX chamber to form at least a part of the oxide layer. Any remaining vacancies in the recesses may be filled with a dielectric material.

The dielectric material may be deposited, for example, as a layer over the base member. An unwanted portion of the dielectric material may be removed by etching or by polishing. A portion of the dielectric material may be provided to and remain on an upper surface of the base member to provide a dielectric layer for forming a portion of an integrated circuit device, such as a gate oxide for a transistor or a dielectric for a capacitor.

It is a desired goal that the present invention provide improved isolation by providing a sub-liner layer of a high quality oxide.

BRIEF DESCRIPTION OF THE DRAWING(S)

Features and advantages of the present invention will become more apparent from the following detailed description of the preferred embodiment(s) described below in detail with reference to the accompanying drawings where:

DETAILED DESCRIPTION OF THE PREFERRED EMBODIMENT(S)

Figure 1:
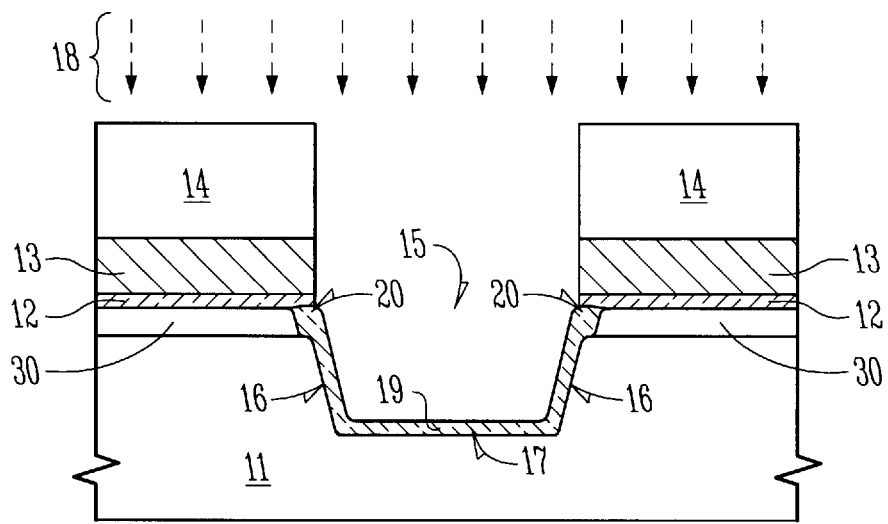
FIG. 1 is a cross-sectional view of an exemplary portion of an embodiment of an in-process shallow trench isolation (STI) structure in accordance with the present invention.

Referring to FIG. 1, there is shown a cross-sectional view of an exemplary portion of an embodiment of an in-process shallow trench isolation (STI) structure in accordance with the present invention. Substrate 11 has a f* dielectric layer 12 formed thereon. Layer 12 may be a thermally grown oxide, such as a transistor gate oxide. A second dielectric layer 13 is formed on layer 12. Layer 13 may be a nitride or dielectric anti-reflective coating (DARC) layer. On layer 13 is mask layer 14. Mask layer 14 may be a resist used in microlithography. Layers 12, 13, and 14 do not form part of such an STI structure.

Layer 14 is patterned to expose regions for forming recess ("trench") 15. By trench, it is meant to include any recessed contour, such as a hole, groove, and the like. Moreover, by substrate, it is meant to include any semiconductor layer, and by substrate assembly, it is meant to include any substrate having one or more layers formed thereon or doped regions formed therein.

Trench 15 includes sidewall ("sidewalls") 16 and bottom surface 17. While trench 15 is shown with sloped or tapered sidewalls 16, it may be formed by an anisotropic etch to form vertical sidewalls. However, sloped sidewalls 16 facilitate filling of trench 15.

Optionally, a doping or damaging implant 18 may be used after etching trench 15. Such implantation facilitates an increased rate of oxidation for subsequent processing. This may be advantageous for subsequent filling, especially with respect to using sloped sidewalls 16, which are subject to a vertical implant. For if oxidation occurs more readily along bottom surface 14 and sidewalls 13 in forming layer 19, then less volume in trench 15 needs to be filled. If implant 18 is used, HIPOX processing may optionally be sustained to further fill trench 15 with the formation of layer 19. Layer 19 is at least about 100 angstroms thick ($1 \times 10^{-8}$ meters), and preferably in a range of about 100 to 250 angstroms thick.

Layer 19 is formed at least in part in trench 15. Layer 19 may be formed by thermal oxidation or by high-pressure oxidation (HIPOX).

HIPOX

In the HIPOX embodiment for forming layer 19, pressure in a range of about 2 to 200 atmospheres and temperature of at least about 650 degrees Celsius may be used. However, the preferred conditions are pressure in a range of about 10 to 25 atmospheres and temperature in a range of about 850 to 1050 degrees Celsius. In this embodiment, silicon dioxide ($SiO_2$) layer 19 is formed in a HIPOX chamber, where oxygen ($O_2$) is introduced at a pressure of about 10 atmospheres. Though $O_2$ is employed in this embodiment, other forms of oxidizing gases may be used.

Notably, a liner or sub-layer formed by HIPOX advantageously provides "corner rounding." Because oxidation kinetics proceeds faster at corners during HIPOX, as compared to conventional oxidation, a thicker barrier layer is obtained about the rim of trench 15. A thicker barrier about the rim reduces the probability of subthreshold voltage leakage of charge from an adjacent transistor.

Optionally, a nitrogen containing gas (e.g., $N_2O$ and NO) may be introduced in-situ into the HIPOX chamber to form layer 19. By in-situ it is meant without having to break vacuum in the chamber. Such nitrogen containing gas may be introduced during the formation of layer 19 or after the formation of layer 19. Layer 19 may be formed so that it contains about 0.1 to 3.5 percent nitrogen.

Thermal Oxidation

In the formation of layer 19 by thermal oxidation, $O_2$ is introduced; however, other forms of oxidizing gases (e.g., $O_3$) may be used. Temperature employed for this embodiment is about 800 to 1000 degrees Celsius for a furnace approach at about one atmosphere, and about 1000 to 1150 degrees Celsius for a rapid-thermal process (RTP) at about one atmosphere. As active area regions 30 are formed by the addition of impurities into substrate 11, thermal oxidation encroaches into active area regions 30 at edge 20 of trench 15. It will be appreciated by one of ordinary skill in the art of the present invention that such encroachment provides additional isolation of devices formed proximally near edge 20, as shown in FIG. 2.

Figure 2:
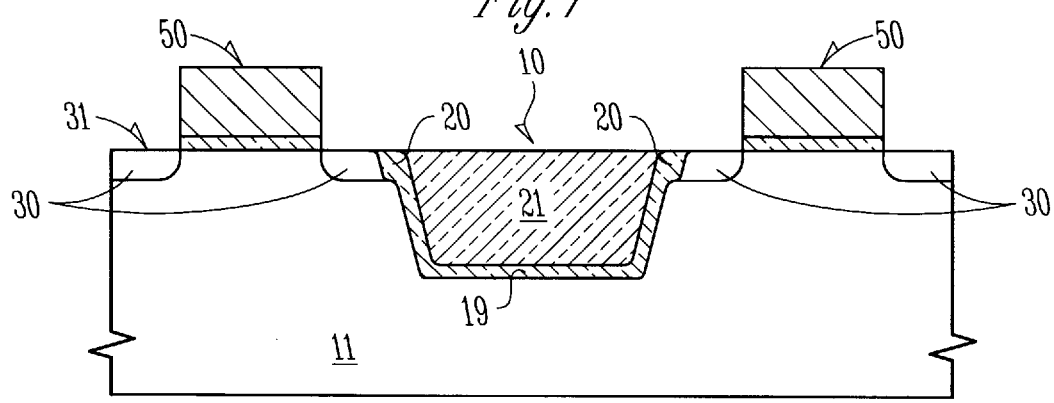
FIG. 2 is a cross-sectional view of an exemplary portion of a completed STI structure in accordance with the present invention.
Figure 3:
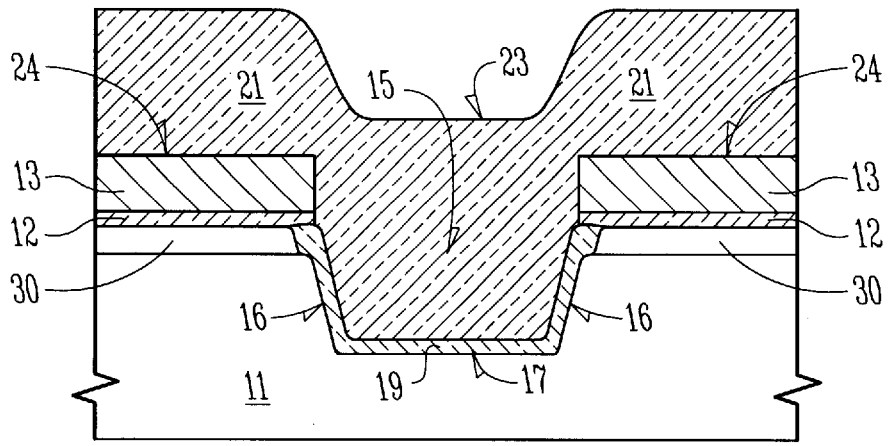
FIG. 3 is a cross-sectional view of an exemplary portion of the embodiment of the STI structure in FIG. 1 after filling with a dielectric material.

Referring to FIG. 2, there is shown a cross-sectional view of STI structure 10 near "active areas" or conductive regions 30 formed in substrate 11 adjacent to transistors 50 in accordance with the present invention. Conventionally, such active areas are about 0.2 microns or less deep as measured from a top surface 31 of substrate 11. Thickness of layer 19 is at least 50 percent thicker adjacent to regions 30 as compared to its thickness elsewhere in trench 15. As conductive regions 30 are shallow with respect to depth of recesses 15, conductive regions 30 may be formed prior to formation of one or more recesses 15. Referring to FIG. 3, there is shown a cross-sectional view of an exemplary portion of the embodiment of the STI structure in FIG. 1 after filling with layer 21. Layer 14 is removed in a conventional manner. Next, layer 21 may be formed of a doped or undoped silicon oxide. Some undoped silicon oxides include thermal TEOS and high-density plasma (HDP) silicon oxides. Some doped silicon oxides include PSG, BSG, BPSG, B-TEOS, P-TEOS, F-TEOS, silicon germanium oxide, and the like. In this embodiment, a sub-quarter micron trench 15 (as measured across bottom surface 17) was formed without partial filling facilitated by implant 18, so an HDP deposition was used to fill trench 15.

Figure 4:
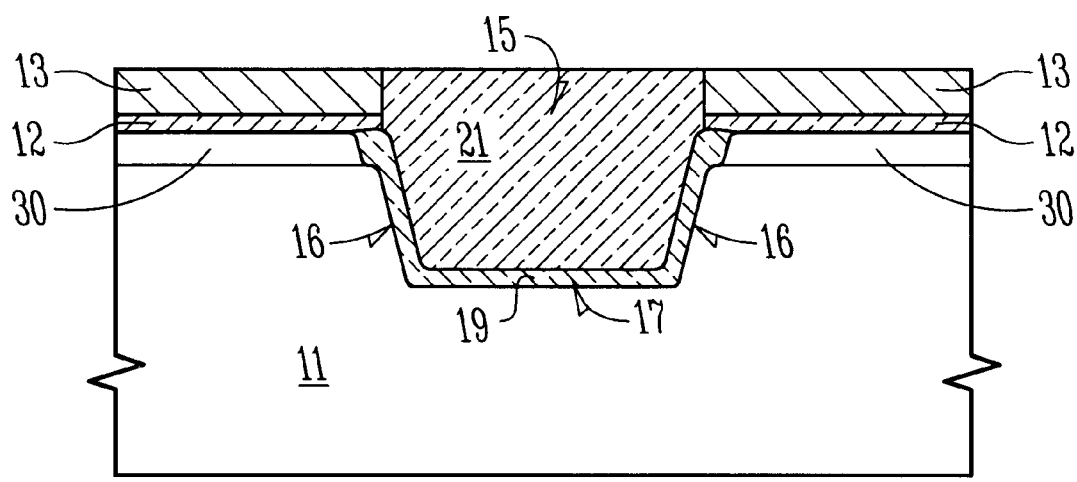
FIG. 4 is a cross-sectional view of an exemplary portion of the embodiment of the STI structure of FIG. 3 after planarization.

Layer 21 may subsequently be planarized by CMP, etch back, and the like, as illustratively shown in the cross-sectional view of FIG. 4. Accordingly, in this embodiment lower surface 23 (shown in FIG. 3) of layer 21 is 500 to 1000 angstroms above upper surface 24 (shown in FIG. 3) of layer 13, so a stop on layer 13 planarization process may be employed.

Figure 5:
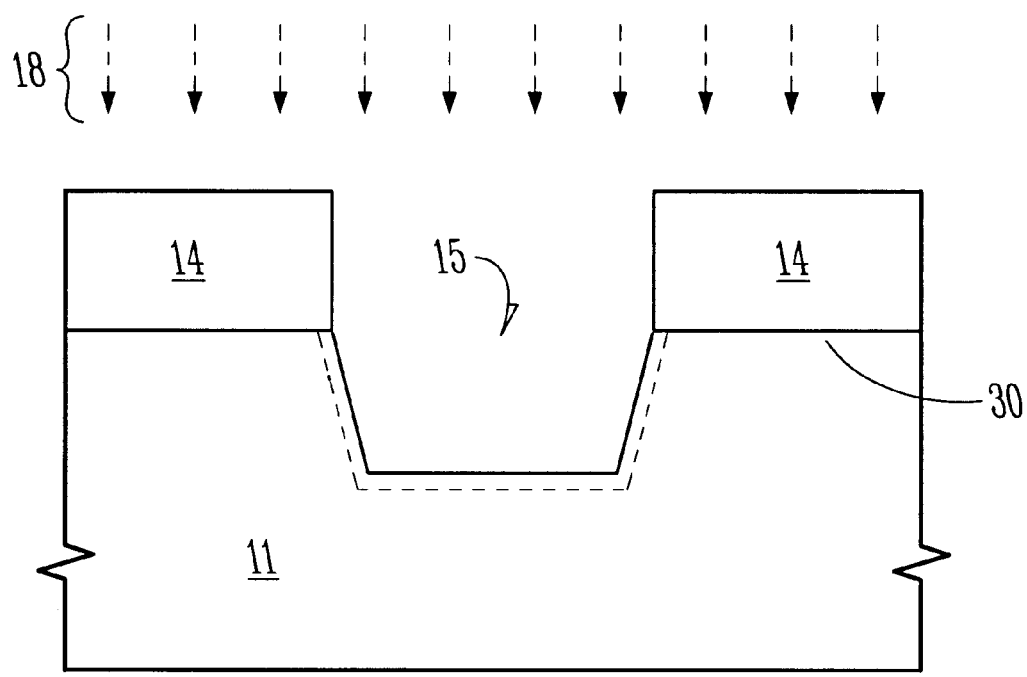
FIG. 5 is a cross-sectional view of an exemplary portion of an alterante embodiment of an in-process shallow trench isolation (STI) structure in accordance with the present invention.
Figure 6:
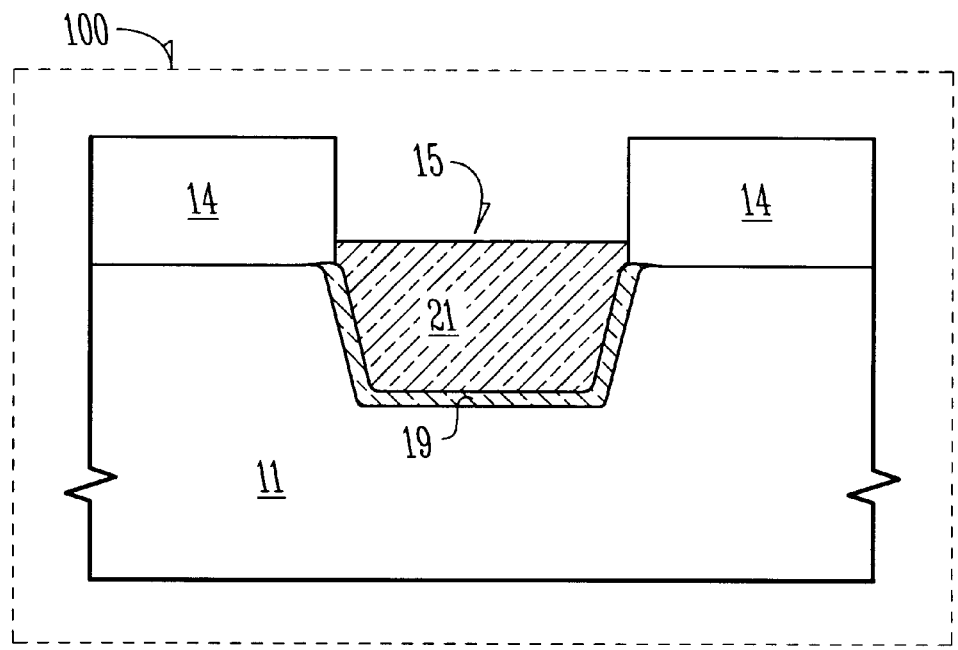
FIG. 6 is a cross-sectional view of an exemplary portion of the embodiment of the STI structure in FIG. 5 after filling with a dielectric material.

Alternatively, an STI structure in accordance with the present invention may be formed prior to formation of a gate oxide layer 12, as illustratively shown in the cross-sectional views of FIGS. 5 and 6. With respect to FIGS. 5 and 6 in combination, layers 12 and 13 are omitted, and layer 14 is patterned on substrate 11 for forming trench 15. After trench 15 is etched, implant 18 may be used to facilitate at least a partial fill of trench 15 during the formation of layer 19 by HIPOX. $N_2O$, NO, $NH_3$, among other gases may be introduced into HIPOX chamber 100 to form layer 19. Owing to at least a partial filling of trench 15, trench 15 has an aspect ratio in which layer 21 may be thermally grown, deposited (such as by a chemical vapor deposition process), or grown by rapid thermal oxidation for filling a sub-quarter micron dimension trench. Moreover, layer 21 may be formed with HIPOX. If no partial filling is used, an HDP oxidation process may be preferred for filling trench 15.

If desired, layer 21 may then be planarized down to be level with a top surface of substrate 11, or to a desired level extending above the top surface of substrate 11.

Figure 7:
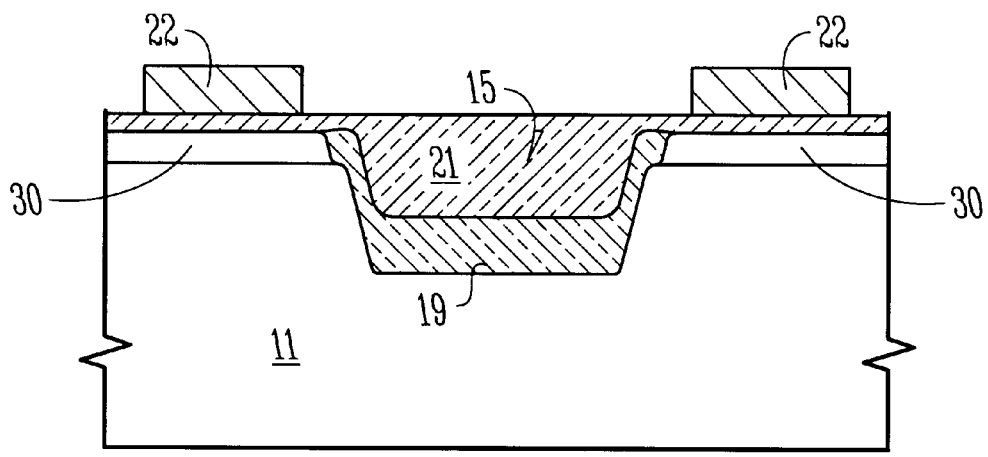
FIG. 7 is a cross-sectional view of an exemplary portion of the embodiment of the STI structure of FIG. 6 after planarization.

Alternatively, layer 14 may be removed prior to formation of layer 21, as illustratively shown in the cross-sectional view of FIG. 7. In which embodiment, layer 21 may be planarized to a level extending above the top surface of substrate 11. A portion of layer 21 may then provide a gate dielectric for a transistor gate 22.

Formation of layer 19 or 21 may be followed by a high pressure anneal for purposes of densification. Such densification may be accomplished in-situ in a HIPOX chamber with respect to layer 19 formation; moreover, nitrogen containing gases may be supplied during a HIPOX anneal to affect electrical properties of layer 21. For a HIPOX anneal, temperature of at least about 650 degrees Celsius, preferably 850 to 1050 degrees Celsius, may be use, and pressure in a range of about 2 to 200 atmospheres, preferably 10 to 25 atmospheres. Alternatively, a thermal process may be used for densification, such as a rapid thermal process (RTP) with a temperature in a range of about 1000 to 1150 degrees Celsius at about one atmosphere or a furnace anneal with a temperature in a range of about 800 to 1000 degrees Celsius at about one atmosphere.

Densification may be employed to reduce the likelihood of a "seam" or "void" resulting from a bad or incomplete fill of trench 15, especially, as sub-layer 19 is of a sufficient quality to reduce the likelihood of dopants in layer 21 from diffusing to substrate 11.

Figure 8:
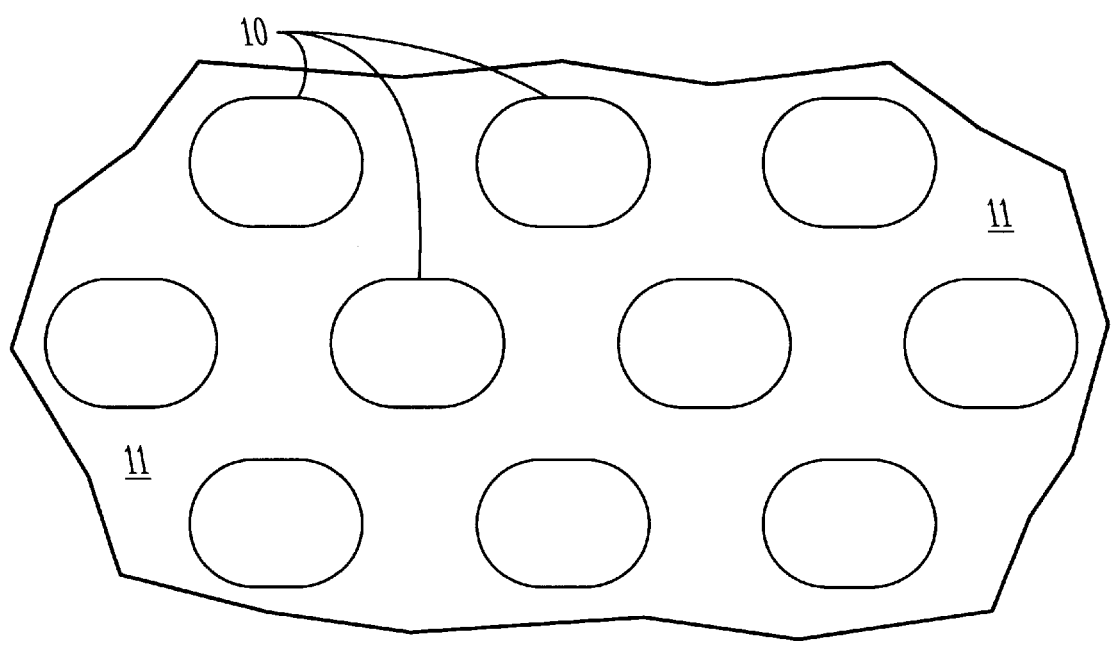
FIG. 8 is a top elevation view of a plurality of STI structures in accordance with the present invention.

The above-described the present invention is particularly suited to high-density integration, such as in a dynamic random access memory array with sub-quarter micron dimensions. In FIG. 8, there is shown a top elevation view of a plurality of STI structures 10 in accordance with the present invention.

The present invention has been particularly shown and described with respect to certain preferred embodiment(s). However, it will be readily appreciated to those of ordinary skill in the art that a wide variety of alternate embodiments, adaptations or variations of the preferred embodiment(s), and/or equivalent embodiments may be made without departing from the intended scope of the present invention as set forth in the appended claims. Accordingly, the present invention is not limited except as by the appended claims.

What is claimed is:

1. A semiconductor isolation structure comprising:
    a first trench oxide layer including:
        a pair of side portions;
        a pair of upper edge portions coupled to the pair of side portions wherein the pair of upper edge portions are approximately 50% thicker than the pair of side portions at an interface between the upper edge portions and an active region;
        a bottom portion, the bottom portion being approximately 0.25 microns wide or less; and
    a second trench oxide layer deposited over the first trench oxide layer.

2. The semiconductor isolation structure of claim 1, wherein the first trench oxide layer includes nitrogen.

3. The semiconductor isolation structure of claim 1, wherein the second trench oxide layer includes doped silicon oxide.

4. The semiconductor isolation structure of claim 1, wherein the first trench oxide layer includes silicon dioxide ($SiO_2$).

5. The semiconductor isolation structure of claim 1, wherein the isolation structure forms a trench with a long axis and a short axis.

6. The semiconductor isolation structure of claim 1, wherein the second trench oxide layer is planarized to only fill a region between the side portions and bottom portion of the first trench oxide layer.

7. A semiconductor electrical device comprising:
    an active region coupled to a semiconductor substrate;
    a first trench oxide layer located adjacent to the active region, the first trench oxide layer including:
        a pair of side portions;
        a pair of upper edge portions coupled to the pair of side portions wherein the pair of upper edge portions are approximately 50% thicker than the pair of side portions at an interface between the upper edge portions and the active region;
        a bottom portion, the bottom portion being approximately 0.25 microns wide or less; and
    a second trench oxide layer deposited over the first trench oxide layer.

8. The semiconductor electrical device of claim 7, wherein the first trench oxide layer includes nitrogen.

9. The semiconductor electrical device of claim 7, wherein the second trench oxide layer includes doped silicon oxide.

10. The semiconductor electrical device of claim 7, wherein the first trench oxide layer includes silicon dioxide ($SiO_2$).

11. The semiconductor electrical device of claim 7, wherein the isolation structure forms a trench with a long axis and a short axis.

12. The semiconductor electrical device of claim 7, wherein the second trench oxide layer is planarized to only fill a region between the side portions and bottom portion of the first trench oxide layer.

13. The semiconductor electrical device of claim 7, wherein the active region includes a source/drain region of a transistor.

14. A semiconductor electrical device comprising:
    a source/drain region;
    a channel region coupled to the source drain region;
    a gate oxide located over the channel region;
    a first trench oxide layer located adjacent to the source/drain region, the first trench oxide layer including:
        a pair of side portions;
        a pair of upper edge portions coupled to the pair of side portions and located beneath the gate oxide wherein the pair of upper edge portions are approximately 50% thicker than the pair of side portions;
        a bottom portion, the bottom portion being approximately 0.25 microns wide or less; and
    a second trench oxide layer deposited over the first trench oxide layer.

15. The semiconductor electrical device of claim 14, wherein the first trench oxide layer includes nitrogen.

16. The semiconductor electrical device of claim 14, wherein the second trench oxide layer includes doped silicon oxide.

17. The semiconductor electrical device of claim 14, wherein the first trench oxide layer includes silicon dioxide ($SiO_2$).

18. The semiconductor electrical device of claim 14, wherein the isolation structure forms a trench with a long axis and a short axis.

19. The semiconductor electrical device of claim 14, wherein the second trench oxide layer is planarized to only fill a region between the side portions and bottom portion of the first trench oxide layer.

20. The semiconductor electrical device of claim 14, wherein the gate oxide includes a silicon dioxide layer and a nitride layer.

21. An integrated circuit comprising:
a number of active regions in a semiconductor substrate;
a number of isolation structures separating the number of active regions in the semiconductor substrate, each isolation structure including:
  a first trench oxide layer located adjacent to the active region, the first trench oxide layer including:
    a pair of side portions;
    a pair of upper edge portions coupled to the pair of side portions wherein the pair of upper edge portions are approximately 50% thicker than the pair of side portions at an interface between the upper edge portions and an active region;
    a bottom portion, the bottom portion being approximately 0.25 microns wide or less; and
  a second trench oxide layer deposited over the first trench oxide layer.

22. The integrated circuit of claim 21, wherein the first trench oxide layer includes nitrogen.

23. The integrated circuit of claim 21, wherein the second trench oxide layer includes doped silicon oxide.

24. The integrated circuit of claim 21, wherein the first trench oxide layer includes silicon dioxide ($SiO_2$).

25. The integrated circuit of claim 21, wherein the number of isolation structures each form a trench with a long axis and a short axis.

26. The integrated circuit of claim 21, wherein the second trench oxide layer is planarized to only fill a region between the side portions and bottom portion of the first trench oxide layer.

27. The integrated circuit of claim 21, wherein the number of active regions each include a source/drain region of a transistor.

28. An integrated circuit comprising:
a number of transistors in a semiconductor substrate, each transistor including:
  a pair of source/drain regions;
  a channel region; a number of isolation structures separating the number of transistors in the semiconductor substrate, each isolation structure including:
  a first trench oxide layer located adjacent to one of the pair of source/drain regions, the first trench oxide layer including:
    a pair of side portions;
    a pair of upper edge portions coupled to the pair of side portions, wherein the pair of upper edge portions are approximately 50% thicker than the pair of side portions at an interface between the upper edge portions and an active region;
    a bottom portion that is approximately 0.25 microns wide or less; and
  a second trench oxide layer deposited over the first trench oxide layer and over the channel region of the number of transistors to form a number of gate oxides.

29. The integrated circuit of claim 28, wherein the first trench oxide layer includes nitrogen.

30. The integrated circuit of claim 28, wherein the second trench oxide layer includes doped silicon oxide.

31. The integrated circuit of claim 28, wherein the first trench oxide layer includes silicon dioxide ($SiO_2$).

32. The integrated circuit of claim 28, wherein the number of isolation structures each form a trench with a long axis and a short axis.

33. A semiconductor isolation structure formed by the process comprising:
providing a semiconductor layer;
forming a recess in the semiconductor layer, the recess having a sidewall and a bottom surface, the bottom surface having a width as measured across the bottom surface of less than or equal to 0.25 microns;
oxidizing at least a substantial portion of the semiconductor layer adjacent to the recess to provide a first dielectric layer;
oxidizing a portion of an active region to form upper edge portions of the first dielectric layer that are approximately 50% thicker than a remaining portion of the first dielectric layer, the first dielectric layer being formed using high-pressure oxidation; and
at least substantially filling the recess with at least a portion of a second dielectric layer.

34. The semiconductor isolation structure of claim 33, wherein the process of high-pressure oxidation includes pressures in a range of approximately 10–25 atmospheres and temperatures in a range of approximately 850–1050° C.

35. The semiconductor isolation structure of claim 33, wherein the dielectric layer includes approximately 0.1 to 3.5 percent nitrogen.

36. A semiconductor electrical device formed by the process comprising:
providing a semiconductor layer;
forming an active region in the semiconductor layer;
forming a recess in the semiconductor layer adjacent to the active region, the recess having a sidewall and a bottom surface, the bottom surface having a width as measured across the bottom surface of less than or equal to 0.25 microns;
oxidizing at least a substantial portion of the semiconductor layer adjacent to the recess to provide a first dielectric layer;
oxidizing a portion of the active region to form upper edge portions of the first dielectric layer that are approximately 50% thicker than a remaining portion of the first dielectric layer, the first dielectric layer being formed using high-pressure oxidation; and
at least substantially filling the recess with at least a portion of a second dielectric layer.

37. The semiconductor electrical device of claim 36, wherein the process of high-pressure oxidation includes pressures in a range of approximately 10–25 atmospheres and temperatures in a range of approximately 850–1050° C.

38. The semiconductor electrical device of claim 36, wherein the dielectric layer includes approximately 0.1 to 3.5 percent nitrogen.

39. The semiconductor electrical device of claim 36, wherein the active region includes a source/drain region of a transistor.

* * * * *

UNITED STATES PATENT AND TRADEMARK OFFICE
CERTIFICATE OF CORRECTION

PATENT NO.    : 6,414,364 B2
DATED         : July 2, 2002
INVENTOR(S)   : Randhir P.S. Thakur and Richard Lane It is certified that error appears in the above-identified patent and that said Letters Patent is hereby corrected as shown below:

<u>Column 3,</u>
Line 10, delete "f*" and insert -- first --, therefor.

Signed and Sealed this

Sixth Day of May, 2003

JAMES E. ROGAN
*Director of the United States Patent and Trademark Office*